United States Patent [19]

Daughton et al.

[11] Patent Number: 4,751,677
[45] Date of Patent: Jun. 14, 1988

[54] DIFFERENTIAL ARRANGEMENT MAGNETIC MEMORY CELL

[75] Inventors: James M. Daughton, Edina; Per N. Forssell, Minneapolis, both of Minn.

[73] Assignee: Honeywell Inc., Minneapolis, Minn.

[21] Appl. No.: 908,075

[22] Filed: Sep. 16, 1986

[51] Int. Cl.⁴ ............................................. G11C 11/15
[52] U.S. Cl. ..................................... 365/158; 365/173
[58] Field of Search .................. 365/158, 173, 8, 207; 338/217; 323/368; 327/252, DIG. 1; 360/113

[56] References Cited

U.S. PATENT DOCUMENTS

| | | | |
|---|---|---|---|
| 3,150,315 | 9/1964 | Simon | 324/DIG. 1 |
| 3,218,616 | 11/1965 | Huijer et al. | |
| 3,432,832 | 3/1969 | Holtwijk | |
| 3,493,943 | 2/1970 | Raffel | |
| 3,531,780 | 9/1970 | Huijer | |
| 3,798,623 | 3/1974 | Kaske et al. | 365/173 |
| 3,883,858 | 5/1975 | Lienhard et al. | |
| 3,898,554 | 8/1975 | Knudsen | 324/DIG. 1 |
| 3,996,575 | 12/1976 | Battarel | |
| 4,208,725 | 6/1980 | Paul et al. | |
| 4,356,523 | 10/1982 | Yeh | |
| 4,455,626 | 6/1984 | Lutes | |
| 4,470,873 | 9/1984 | Nakamura | 365/8 |

OTHER PUBLICATIONS

"Magnetoresistive Readout for 200-Nsec TF Memory," *Electronic Design*, Mar. 15, 1962, p. 31.
"Magnetoresistive Readout of Thin-Film Memories," *Digest of Technical Papers*, 1962 International Solid-State Circuits Conference, P. Huijer, pp. 36-37.
"Magnetoresistance in Laminated NiFe Films," *Journal of Applied Physics*, vol. 53, No. 3, Mar. 1982, van Ooyen, et al., pp. 2596-2598.
"Magnetoresistive Switching of Small Permalloy Sandwich Structures," *Journal of Applied Physics*, vol. 55, No. 2, Jan. 15, 1984, Berchier, et al, pp. 487-492.

*Primary Examiner*—James W. Moffitt
*Attorney, Agent, or Firm*—William T. Udseth

[57] ABSTRACT

A memory cell having a plurality of storage structures in a differential arrangement. Two multilayered magnetoresistive memory cells are placed in a bridge arrangement with two impedance devices. The memory cells have one bridge juncture in common. Switches are connected to at least two of the four bridge junctures to permit the writing or reading of the magnetic state of the storage cells. The bridge arrangement combined with the appropriate switching action allows for a near doubling of the magnitude of the output sense signal while reducing the noise component of such signal.

9 Claims, 3 Drawing Sheets

DIFFERENTIAL ARRANGEMENT MAGNETIC MEMORY CELL

Reference is hereby made to earlier filed copending applications by J. M. Daughton and A. V. Pohm entitled "Magnetic Memory" having Ser. No. 870,068 filed 6-3-86, and by J. M. Daughton and J. S. T. Huang entitled "Magnetic Memory Configuration" having Ser. No. 879,679 filed 6-27-86. These copending applications have been assigned to the same assignee as the present application.

BACKGROUND OF THE INVENTION

The present invention relates to ferromagnetic thin film memories, and more particularly, to ferromagnetic thin film memory cells based on multiple magnetic structures.

Digital memories are used extensively in digital systems of many kinds including computers and computer system components, and digital signal processing systems. Such memories can be advantageously based on the storage of digital bits as alternative states of magnetization in magnetic materials in each memory cell, typically thin film materials. These may be ferromagnetic thin film memories which may provide access to information stored therein by either inductive sensing to determine the magnetization state, or by magnetoresistive sensing for such determination. Such ferromagnetic thin film memories may be provided on the surface of a monolithic integrated circuit to provide for convenient electrical interconnections between the memory cell and the memory operating circuitry.

Ferromagnetic thin film memory cells are usually made very small and packed very closely together to achieve a significant density of stored bits, particularly when provided on a surface in a monolithic integrated circuit. The magnetic environment can become quite complex with fields in any one memory cell affecting the film portions in neighboring memory cells. Also, small ferromagnetic film portions in a memory cell can lead to substantial demagnetizing fields which can cause instabilities in the magnetization state desired in such a cell.

These magnetic effects between neighbors in an array of closely packed ferromagnetic thin film memory cells can be ameliorated to a considerable extent by providing a memory cell based on an intermediate separating material having two major surfaces on each of which an anisotropic ferromagnetic memory film is provided. Such an arrangement provides a significant "flux closure" to thereby confine the magnetic fields arising in a cell to affecting primarily just that cell. This is considerably enhanced by choosing the separating material and the ferromagnetic memory film to be sufficiently thin.

Often such a digital memory is constructed by having a number of memory cell storage structures (or bit structures if a single structure per bit) connected in series at junctures to one another in an end-to-end fashion. A series of current straps, or word lines, are often provided in an orthogonal layout to the series of connected storage structures so that a strap crosses each of the structures between the junctures. In a magnetoresistive memory, such straps or word lines are used both in the entering of and the sensing of information in the bit structures. This can be done by using currents in the word lines for setting, or for determining the existing, magnetization state of storage structures in the memory.

However, with respect to magnetic fields generated by word lines over a storage structure there is no "flux closure." This is because the word line is over the top of a bit structure so that there is no closed magnetic path for magnetic fields in the structure around the word line. The result is that very large demagnetizing fields can occur in a bit structure both for entering information and for sensing information in that structure. Such fields can seriously disrupt operation of the memory.

These demagnetizing fields can be reduced by properly configuring such bit structures, providing a narrowing geometry towards the ends of the structures where they come to and under the junctures. A narrowed portion of magnetic material may extend entirely through the storage structure juncture.

With such magnetic structure arrangements, the resultant magnetization of bit or storage structures becomes more stable giving better defined alternative magnetization states for storing digital information. In those memory cell structures in which such information is to be extracted therefrom by use of the magnetoresistive properties to assess which of these magnetization states occurs in the ferromagnetic memory films, some sort of sensing current is applied through the storage structures.

Storage structures formed as bit structures, being in one of two alternate magnetization states typified by having the magnetization vector point in one of two opposite directions more or less along the easy axis, will have correspondingly different resistances at least during a reading operation depending on which magnetization state such structure is in. The sense current provided through the structure will then lead to different voltage drops across the structure depending on its magnetization state thereby providing the information as to the state it is in. Alternatively, a sensing voltage could be applied to such bit structures with resulting current differences because of the resistance differences indicating which magnetization state is present in a bit structure.

The signal information thus obtained will be relatively small because the change in resistance as fraction of the resistance of the entire bit structure is relatively small. Furthermore, the energization source to provide the sensing current or voltage will have an electrical noise component supplied therewith which, along with noise generated in the bit structure itself, will make the small signal containing the digital state information relatively difficult to discern out of the total electrical response obtained from a bit structure. Thus, an arrangement to provide an increase in such a signal and to reduce electrical noise would be desirable.

SUMMARY OF THE INVENTION

The present invention provides a digital memory cell having a plurality of storage structures in a differential arrangement which has currents permitted to flow therein by a selective action of switches connected to at least one of the diagonally opposite interconnection junctures in the differential arrangement. The magnetization states of the storage structures can be determined by the electrical conditions resulting at some of the junctures.

DESCRIPTION OF THE PREFERRED EMBODIMENTS

Figure 1:
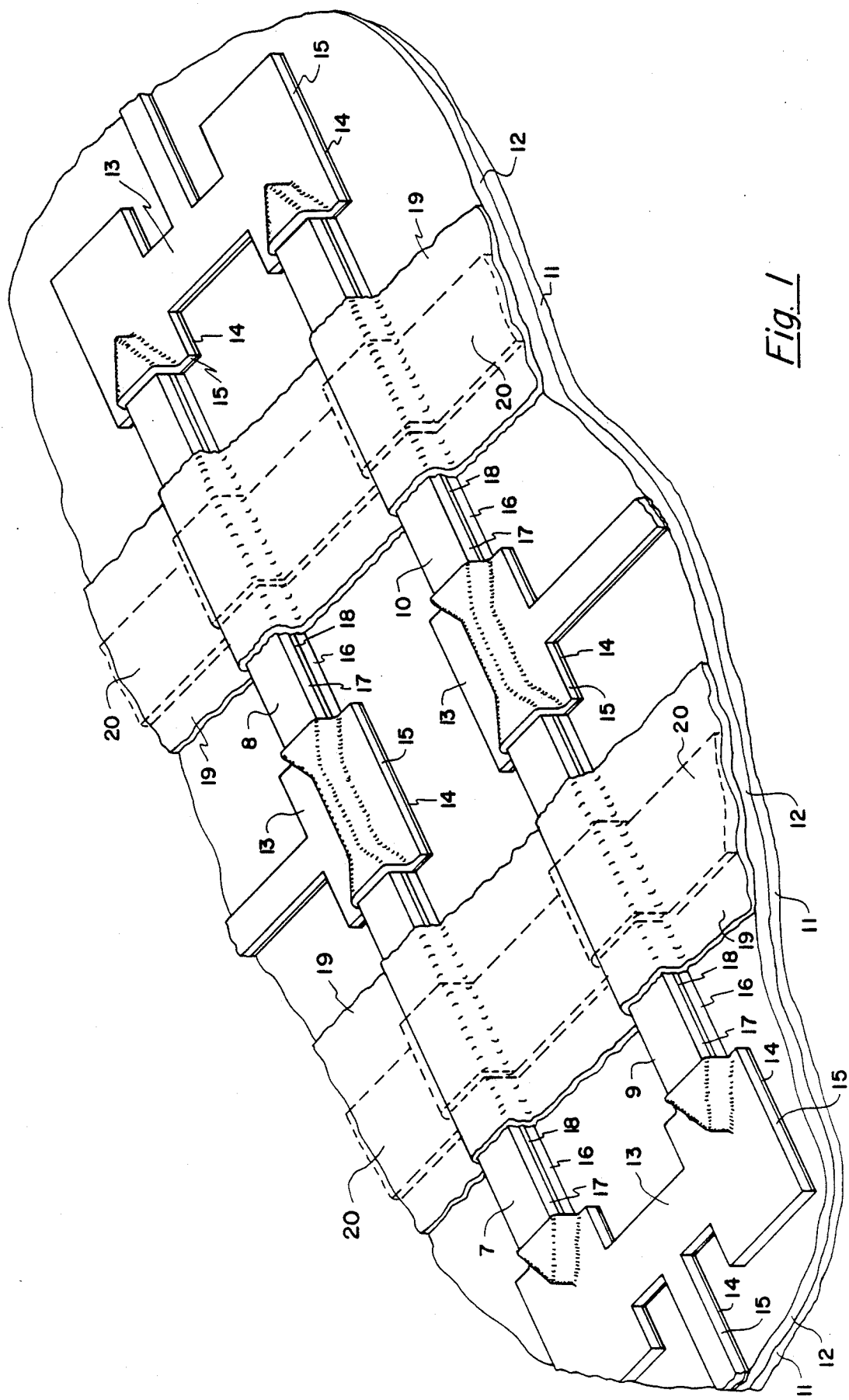
FIG. 1 shows a storage structure in a memory cell connected in a differential arrangement.

A metallic thin film useful in making magnetic thin film memories is an alloy of nickel, cobalt and iron. Typically, the proportions are chosen to strongly reduce or eliminate any magnetostrictive effects in the film and to improve certain other properties of the film for the application at hand. As a possible example, the film material might comprise approximately sixty percent (60%) nickel, twenty-five percent (25%) cobalt and fifteen percent (15%) iron. In some situations other materials are added to the alloy in relatively small amounts to improve selected properties of the film.

Such films can be fabricated by vacuum deposition or by other methods and, if done in the presence of a magnetic field oriented in a selected direction, the resulting magnetic thin film will exhibit uniaxial anisotropy with the easy axis parallel to such magnetic field orientation. Because very large demagnetizing fields will otherwise result, the magnetization vector of such a film will always lie in the plane of the film.

Furthermore, in accord with thermodynamics, the magnetization of such a film will arrange itself to minimize the magnetic energy. In the absence of any externally applied magnetic fields such minimization occurs when the magnetization vector of a film portion or section parallels its easy axis, pointing in either direction along such axis. This may not be the case in a situation where more than one domain occurs or where other boundaries arise in the magnetic film leading to bounded regions having magnetizations in various orientations. In such situations, the average magnetization for the film may lie at some angle to the easy axis.

In any event, the situation of such a film portion changes in the presence of externally applied magnetic fields. The minimization of magnetic energy may then occur with the magnetization vector for the film oriented at some angle, with respect to the easy axis, differing from the angle occurring, if any, in the absence of the external field. As long as the magnetization of the film portion is in a single domain state, the magnetization vector then can be caused to rotate with respect to the easy axis to angles determined by the externally applied fields, and this can occur without substantially affecting the magnitude of the magnetization.

In such a state with external magnetic fields applied to the film portion, the total magnetic energy can be approximately determined. The minima of this energy can be calculated as a basis for determining the angle of the magnetization vector with respect to the easy axis, usually as a function of the magnetic field components parallel with and perpendicular to the easy axis.

In addition, the critical values for external magnetic fields can be found which govern transitions of the magnetization vector position from unstable to stable states. The equation for such critical fields is to be found in the form of a hypocycloid, usually termed an astroid, so that external fields of values within the astroid lead to the magnetization being at a stable angle but those values outside the astroid lead to potential instability. This instability is manifested as a flipping of the magnetization vector from pointing at least to some extent along one direction of the easy axis to pointing at least to some extent therealong in the opposite direction. Thus, the magnetization vector can be made to switch from one direction along the eas axis to the opposite which means the magnetization vector can be in one of two different states which provides a basis for storing a binary bit.

Such ferromagnetic thin films as those just described further exhibit magnetoresistance. Differences in direction between that of the magnetization vector in the thin film and that of current passing through the thin film leads to differences in the effective electrical resistance in the direction of the current. The maximum resistance occurs when the magnetization vector in the film and the current direction are parallel, while the minimum occurs when they are perpendicular. Resistance of a magnetoresistive resistor can be shown to be given by a constant value representing the minimum plus an additional value depending on the angle between the current direction of the film and the magnetization vector therein. This additional resistance follows the square of the cosine of that angle.

Thus, external magnetic fields can be used to vary the angle of the magnetization vector in such a film portion with respect to the easy axis of the film, and can vary it to such an extent as to cause switching the magnetization vector between two stable states which occur as magnetizations oriented in opposite directions more or less along the easy axis. Further, the state of the magnetization vector in such a film can be measured or sensed by the change in resistance encountered by a current directed through this film portion. This provides a basis for a film portion to serve as a bit storage means in a memory cell, the state of which is subject to being determined by effects occurring in currents applied to this portion.

However, such operation may not prove achievable if various demagnetizing field effects dominate the magnetic situation. As memory cell film portions become more and more compact and located closer and closer to one another to improve the packing density to thereby keep costs low, the interaction of the magnetic fields occurring in one cell upon its neighbors can become quite significant. Such affects are usually deleterious in that such fields will often act to increase the demagnetizing field experienced in the neighboring cells.

As indicated above, this can be minimized to a considerable extent by use of storage structures based on intermediate separating material having two major surfaces on each of which an anisotropic ferromagnetic memory film is provided. Such a "sandwich structure" can provide a significant amount of "flux closure" to thereby confine the magnetic fields arising in a storage structure to affecting primarily just that structure especially if the film and separating material thicknesses are chosen sufficiently thin. As indicated above, another demagnetizing field problem is that there is no "flux closure" with respect to fields induced by currents through any word lines used over a storage structure. The shaping of the ends of storage structures can ameliorate these effects to a considerable extent.

FIG. 1 shows a memory cell arrangement using four interconnected storage structures each having narrowed ends, these storage structures being designated 7, 8, 9 and 10. The use of multiple storage structures in a memory cell permits an improvement in the signal strength relative to the magnitude of the electrical noise occurring in signals during a reading operation of the memory cell.

The memory cell is formed over a semiconductor material body, 11, as used in a monolithic integrated circuit, and directly on an insulating layer, 12, supported on a major surface of body 11 in the integrated circuit. Only a small portion of the integrated circuit is shown, and then only a small portion of semiconductor material body 11 is shown of that integrated circuit portion.

Juncture interconnections, 13, are shown provided over the "sandwich structure" of the storage structures in which there are two magnetic films separated by a separating material. Juncture interconnections 13 are shown comprising a multiple metal layer arrangement, the first layer, 14, serving as a barrier layer and a second layer, 15, for carrying the bulk of the current. Barrier layer 14 would typically be a 1200 Å thick layer of titanium-tungsten while layer 15 would typically be aluminum alloyed with two percent (2%) copper in a thickness of 5000 Å. Juncture interconnections 13 are also disposed in part on the exposed surface of insulating layer 12, and are shown with circuit interconnections extending therefrom.

Disposed on the exposed major surface of insulating layer 12 are storage structures 7, 8, 9 and 10, partially under junctures 13, which structures are each comprised of a lower ferromagnetic thin film, 16, and an upper ferromagnetic thin film, 17. Ferromagnetic thin film layer 16 and 17 are each as described above in that they exhibit uniaxial anisotropy, magnetoresistance, little magnetorestriction, and are of an alloy composition.

In between ferromagnetic thin film layers 16 and 17 is a further thin film layer, 18, which usually would not exhibit ferromagnetism but may be either an electrical conductor or an electrical insulator. Layer 18 must, however, prevent the exchange interaction between electron spins on neighboring atoms from coupling across between layers 16 and 17 to lock together the magnetization vectors in each. A typical choice for layer 18 would be silicon nitride. An insulating layer, 19, covers storage structures 7, 8, 9 and 10 although only part of it is shown in FIG. 1.

The "sandwich structure" of FIG. 1 is effective in reducing magnetic fields outside bit structure 10 because the magnetic fields occurring in either of ferromagnetic thin film layers 16 and 17 are, to a considerable extent, confined to the magnetic path provided by the other. Thus, the effect of magnetic fields occurring in either of layers 16 and 17 on neighboring bit structures is much reduced.

A further confinement of magnetic fields occurring in storage structures 7, 8, 9 and 10 of FIG. 1 can be achieved by providing magnetic material, not shown, on the sides of these structures.

Finally, a pair of word lines, 20, as shown in FIG. 1 can be disposed on the major surface of insulating layer 19 but may not be and so are shown in dashed line form. Word lines 20 would typically be comprised of an aluminum layer alloy with approximately two percent (2%) copper on a titanium-tungsten base layer with a total thickness of 5000 Å. A protective and insulating layer over the entire structure of FIG. 1 would be used in practice but is not shown.

The easy axis of each of storage structures 7, 8, 9 and 10 will be assumed to be parallel to word lines 20, i.e. a transverse easy axis. However, a longitudinal easy axis could also be used which would extend from a juncture at one end of a storage structure to the juncture at the opposite end The structure of FIG. 1 can be operated in a memory system circuit arrangement which is shown in part in FIG. 2. Storage structures 7, 8, 9 and 10 from FIG. 1 are represented by resistors in FIG. 2 with the same numerical designations to reflect the magnetoresistive properties of these structures. Junctures 13 of FIG. 1 are shown as interconnection points only in FIG. 2.

Establishing magnetizations in the memory cell to represent either a zero or a one, i.e. "writing" in the memory cell, is controlled by a transistor, 30. Transistor 30 is shown here as an enhancement mode, metal-oxide-field-effect transistor (MOSFET), and the system can be arranged so that this transistor can be of either channel conductivity type, but usually chosen as an n-channel transistor. A bipolar transistor could alternatively be used. A way of setting magnetizations for representing one such value would be to have current provided from an energization source at a terminal means, 31, be permitted to flow through transistor 30 and then through parallel branches of storage structures, a branch of storage structures 7 and 8 and a branch of storage structures 9 and 10. Finally, the current would flow out through terminal 32.

The resultant magnetization of each of the storage structures would then have a common orientation with respect to this current path therethrough. That is, the magnetization vector in each structure would lie substantially along the easy axis of the transverse mode in the same direction with respect to the current path therethrough, i.e. more or less perpendicular to such current path. The representation of the opposite value would require reversing the current direction. A further MOSFET transistor, 33, may be used between the storage structures and terminal 32 and to aid in controlling writing currents, and so is shown in dashed line form in FIG. 2. This method of providing one and zero representations would require a substantial current to be carried by the storage structures.

Figure 2:
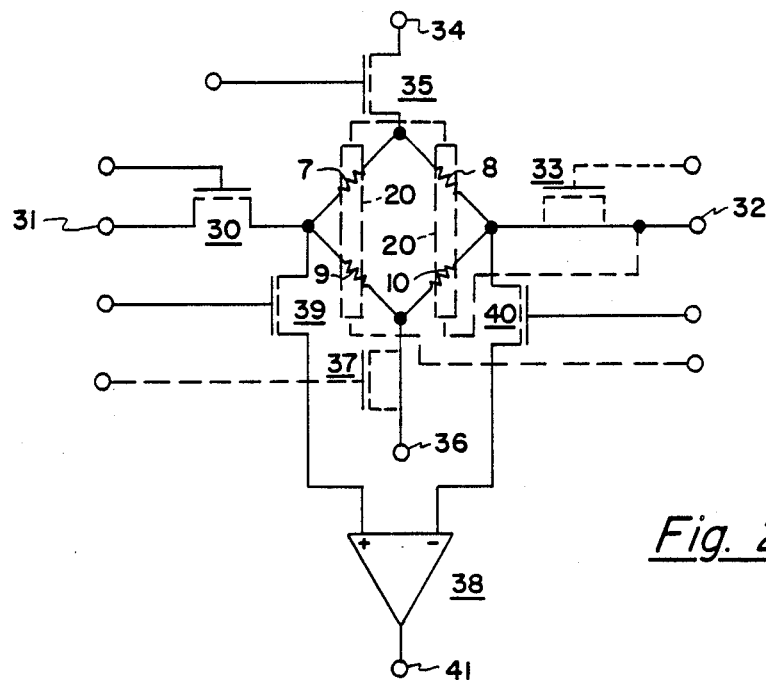
FIG. 2 shows an electrical schematic circuit diagram involving the storage structures of FIG. 1, switches controlling current flows therein, and a sense amplifier.

Alternatively, transistor 30 could be operated in coincidence with current supplied along word lines 20 of FIG. 1 each shown in dashed line form over two of the storage structures in FIG. 2. Currents could be introduced in these word lines 20 at the end terminals thereof by suitable external current sources (ignoring for now the dashed line interconnections shown at these ends). An alternative is shown by the dashed line connections of word lines 20 within the circuit of FIG. 2 where the top end terminals of the word lines are shown electrically connected to one another and the bottom end terminal of the right hand word line is connected to terminal 32. In this arrangement, current supplied at terminal 31 and switched into the memory cell by transistor 30 passes through the storage structures to terminal 32 and then through word lines 20 so that current is coincidently flowing in both word lines 20 and storage structures 7 through 10 all under the control of transistor 30. These storage structures and the word lines are arranged so that the currents through each lead to magnetic fields which combine to set the magnetization vectors in each structure thereby requiring less current to flow than the previous method.

Once such magnetizations have been established in the storage structures of FIG. 2 to represent either a zero or one, this stored information can be sensed at a later time during a "read" operation. Sense current is supplied at terminal means, 34, which can be permitted to flow into storage structures 7 through 10 by a MOSFET transistor, 35. Current permitted to flow by transistor 35 from terminal 34 flows through parallel branches of storage structures, a branch of storage structures 7 and 9 and a branch of storage structures 8 and 10. This current flows then to a further terminal means, 36.

Control of this sensing current flow may be aided by the use of a further transistor in some memory systems. Such a transistor, 37, is shown as a MOSFET transistor in dashed line form in FIG. 2 between storage structures 7 through 10 and terminal 36.

The flow of such a sense current will pass through two of the storage structures (8 and 9 if the previous example of current flow from left to right was the last magnetization vector set operation) in the same direction that currents controlled by transistor 30 flowed, but in the opposite direction in the other two storage structures. The result is that the magnetic fields due to the sense current will rotate the magnetization vectors in two of the storage structures in one direction but, in the other two, the fields will rotate the magnetization vectors in the opposite direction. (This assumes that the magnetization vector established during the writing operation do not lie exactly along the easy axis of the storage structures. This can be expected to be true because of the effects of demagnetizing fields along the edges of the storage structures. However, if found not to be sufficiently true, currents can be introduced along word lines 20 to cause an initial rotation of the magnetization vectors which are then further rotated in response to the sensing current. As a further alternative for initial rotation, some external field could be supplied from another source such as coils or a biasing magnet.)

Again, magnetoresistance effects lead to different resistances in the storage structures if there are different angles of the magnetization vectors in them with respect to the current path through them. Thus, resistance changes will occur which are in the same magnitude direction in those storage structures which are opposite one another in FIG. 2, but the resistance changes will be in opposite magnitude directions in those storage structures which are adjacent to one another. As a result, a voltage difference will occur with the flow of sensing current between the voltage occurring at the juncture between storage structures 7 and 9 and the voltage occurring at the juncture between storage structures 8 and 10. The polarity of the difference between the voltages at these locations will be determined by the information contained in the memory cell, being of one polarity for a stored zero and the opposite polarity if a one had been stored.

These voltages differences and the polarities thereof can be sensed by a sense amplifier, 38. The non-inverting input terminal of sense amplifier 38 is connected to the juncture between storage structures 7 and 9 by transistor, 39. The inverting side of sense amplifier 38 is connected to the juncture between storage structures 8 and 10 by another transistor, 40. When transistors 39 and 40 are switched into the "on" condition, sense amplifier 38 can detect the voltage difference between these junctures and the polarity thereof providing that information at its output, 41.

Because the difference between the voltage at the juncture between storage structures 7 and 9 and the voltage of the juncture of storage structures 8 and 10 is due to voltage changes in the opposite magnitude directions of the midpoints of the voltage dividers in effect formed by the two storage structures connected to each of these junctures, this voltage difference will be about twice that which can be achieved using only a single storage structure. Furthermore, the noise component of the sensing current through transistor 35 which is inevitably present, will be split with the current split through these effective voltage dividers with approximately half on each of these junctures. Therefore, the two noise components from the split will tend to cancel one another to thereby reduce the electrical noise provided to sense amplifier 38. Thus, sense amplifier 38 senses a larger signal in the presence of less noise.

Figure 3:
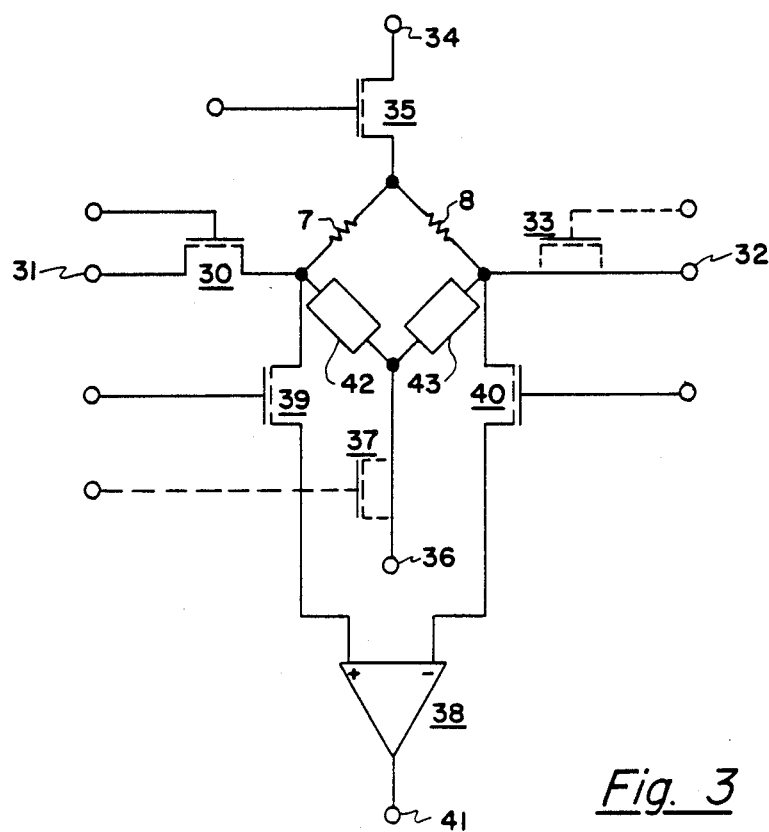
FIG. 3 shows an electrical schematic circuit diagram involving the storage structures except that two have nonmagnetic impedances substituted therefor.

Storage structures 9 and 10, while convenient for providing circuit paths for the sense structure in the same operation in which storage structures 7 and 8 are provided, are not strictly needed and could be replaced by other sorts of circuit components such as passive or active matched impedances. These are indicated in FIG. 3 in which a suitable set of electronic circuit components for this purpose would be contained in a block, 42, substituted for storage structure 9, and a suitable set of components would be contained in a block, 43, substituted for storage structure 10. The components in blocks 42 and 43 could be simple resistors formed in or on the monolithic integrated circuit. Again, word lines could be used in connection with storage structures 7 and 8 but they have not been shown in FIG. 3.

Figure 4:
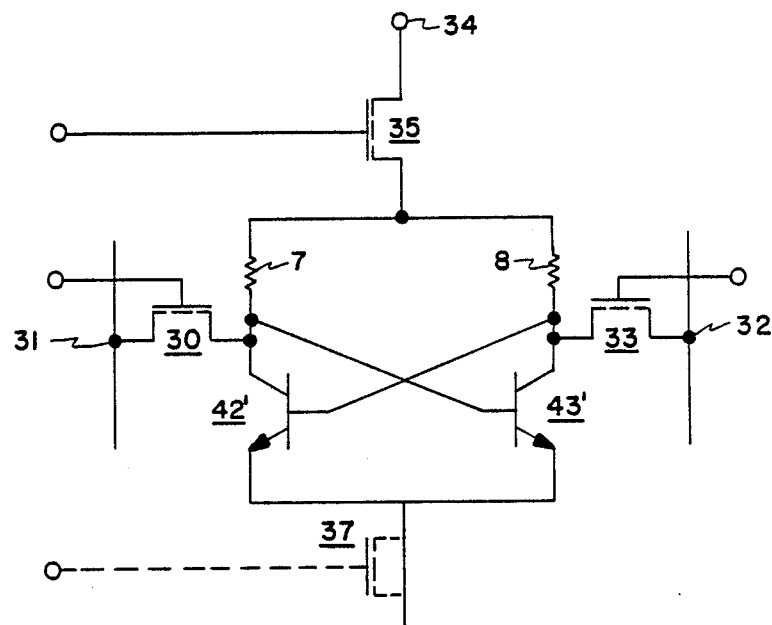
FIG. 4 shows an electrical schematic circuit diagram involving the storage structures except that two of them have transistors substituted therefor.

Alternatively, the components in blocks 42 and 43 could be active electronic components or a combination of active electronic components and some kinds of passive impedance components. One of the simplest alternatives is shown in FIG. 4 where each block is formed by a bipolar transistor designated in FIG. 4 as 42' and 43'. The base of transistor 42' is shown connected to one end of storage structure 8, and symmetrically, the base of transistor 43' is shown connected to one end of storage structure 7.

In this arrangement a bistable circuit, or flip-flop circuit, is formed with storage structures 7 and 8 in the load circuits of bipolar transistors 42' and 43', respectively. Transistors 30 and 33 are used to control the writing of information into the memory cell of FIG. 4 and to sense the voltage difference thereacross arising during the flow of sense current. Thus, current supplied from terminal 31 in a write (later sense) line is permitted to flow in the memory cell by transistor 30. This current flows through storage structure 7 and 8 and out through transistor 33 to terminal 32 in the write (later sense) line at that location. For the writing of the opposite information bit, the current direction is reversed.

Storage structures 7 and 8 must be of a sufficiently low impedance so that the magnetizations thereof can be set as desired by current flowing therethrough which will be limited in magnitude. This limit will arise because of the clamping of the voltage drop across storage structures 7 and 8 in the presence of the base-collector junctions of transistors 42' and 43' thereacross. Various modifications of the circuit in FIG. 4 can be made to prevent such clamping if necessary or desired.

Once the writing operation has finished, the information in the memory cell can be sensed. Transistor 35 can permit voltage and current to be applied to the memory cell. There will be a difference in resistance in storage structures 7 and 8 because of the sense current following the write current direction in one structure but going in the opposite direction in the other. The resulting voltage drop difference across structures 7 and 8 in response to sensing current permitted by transistor 35 to flow through these structures provides the voltage offset across structures 7 and 8 which is necessary to switch the proper one of transistors 42' and 43' into the "on" condition. Once such switching is complete (very rapid) there wil be a much larger steady state voltage drop difference across structures 7 and 8.

The voltage at the collector of transistor 42' can be coupled by transistor 30 to terminal 31, and the voltage at collector 43' can be connected by transistor 33 to terminal 32. Terminals 31 and 32 can then serve as sense lines which can provide these voltages to a sense amplifier like amplifier 38 in FIG. 2 for providing the difference between them and the polarity of the difference as an output signal. As can be seen, transistors 30 and 33 are shown to serve both in connection with the writing operation and with sensing in the reading operation of the memory cell of FIG. 4. Separate writing lines and sensing lines could be provided as in FIG. 3 if desired.

The embodiments of the invention in which an exclusive property or right is claimed are defined as follows:

1. A multiple magnetic structures memory cell, said memory cell comprising:

a plurality of storage structures with each said storage structure comprising an intermediate layer of a kind of separating material having two major surfaces on opposite sides thereof and a memory film on each of said intermediate layer major surfaces with said memory film being of a magnetoresistive, anisotropic magnetic material, including first and second storage structures electrically connected to one another at a first juncture;

first and second impedance means each having first and second terminating regions between which a conductive path is effectively provided of a selected conductivity, said first impedance means second terminating region being electrically connected to said second impedance means first terminating region at a second juncture, said first storage structure being electrically connected between said first juncture and a third juncture with said first impedance means first terminating region being electrically connected to said third juncture, and said second storage structure being electrically connected between said first juncture and a fourth juncture with said second impedance means second terminating region being electrically connected to said fourth juncture; and first and second switching means each having first and second terminating regions between which a conductive path can be provided of a selected conductivity, said first switching means first terminating region being electrically connected to a first terminal means adapted for connection to a first source of electrical energization and said first switching means second terminating region being electrically connected to a selected one of said first and second junctures, said second switching means first terminating region being electrically connected to a second terminal means adapted for connection to a second source of electrical energization and said second switching means second terminating region being electrically connected to a selected one of said third and fourth junctures.

2. The apparatus of claim 1 wherein said first impedance means is a third said storage structure and said second impedance means is a fourth said storage structure.

3. The apparatus of claim 1 wherein said first impedance means also has a control region therein by which said first impedance means is capable of being directed to effectively provide a selected conductivity in said conductive path between said first impedance means first and second terminating regions, and wherein said second impedance means also has a control region therein by which said second impedance means is capable of being directed to effectively provide a selected conductivity in said conductive path between said second impedance means first and second terminating regions.

4. The apparatus of claim 1 wherein said memory cell further comprises a plurality of word line structures each having a pair of word line end terminals adapted to conduct electrical current in at least one direction, each of said pairs of word line end terminals having an electrical conductor electrically connected therebetween which is located across an electrical insulating layer from said memory film on one of said major surfaces of said intermediate layer of a selected one of said storage structures.

5. The apparatus of claim 2 wherein said memory cell further comprises a plurality of word line structures each having a pair of word line end terminals adapted to conduct electrical current in at least one direction, each of said pairs of word line end terminals having an electrical conductor electrically connected therebetween which is located across an electrical insulating layer from said memory film on one of said major surfaces of said intermediate layer of a selected one of said storage structures.

6. The apparatus of claim 3 wherein said first impedance means control region is electrically connected to said second impedance means second terminating region, and said second impedance means control region is electrically connected to said first impedance means first terminating region.

7. The apparatus of claim 5 wherein among said plurality of word line structures are included first and second word line structures with said first word line structure electrical conductor located across electrical insulating layers from each of said memory films on a said major surface of each of said intermediate layers of said first storage structure and said first impedance means, and with said second word line structure electrical conductor located across electrical insulating layers from each of said memory films on a said major surface of each of said intermediate layers of said second storage structure and said second impedance means.

8. The apparatus of claim 6 wherein said first and second impedance means comprise a bipolar transistor.

9. The apparatus of claim 7 wherein one of said first word line structure end terminals is electrically connected to said fourth juncture, and that end terminal remaining of said first word line structure being electrically connected to an end terminal of said second word line structure.

* * * * *